(12) United States Patent
Matsumoto

(10) Patent No.: US 12,198,955 B2
(45) Date of Patent: Jan. 14, 2025

(54) SUBSTRATE TRANSFER METHOD AND SUBSTRATE TRANSFER SYSTEM

(71) Applicant: Tokyo Electron Limited, Tokyo (JP)

(72) Inventor: Wataru Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 304 days.

(21) Appl. No.: 17/810,653

(22) Filed: Jul. 5, 2022

(65) Prior Publication Data

US 2023/0019299 A1 Jan. 19, 2023

(30) Foreign Application Priority Data

Jul. 14, 2021 (JP) .................................. 2021-116712

(51) Int. Cl.
| | |
|---|---|
| *H01L 21/67* | (2006.01) |
| *B25J 9/16* | (2006.01) |
| *B25J 11/00* | (2006.01) |
| *B65G 47/90* | (2006.01) |
| *H01L 21/677* | (2006.01) |
| *H01L 21/68* | (2006.01) |
| *H01L 21/687* | (2006.01) |

(52) U.S. Cl.
CPC ...... *H01L 21/67259* (2013.01); *B25J 9/1653* (2013.01); *B25J 11/0095* (2013.01); *B65G 47/90* (2013.01); *H01L 21/67745* (2013.01); *H01L 21/68* (2013.01); *H01L 21/68707* (2013.01); *G05B 2219/39192* (2013.01); *H01L 21/681* (2013.01)

(58) Field of Classification Search
CPC ......... H10L 21/67248; H10L 21/67742; H10L 21/67745; H10L 21/67739; H10L 21/67706; H10L 21/67259; H10L 21/681; H10L 21/68; H10L 21/68707; B25J 9/1653; B25J 11/0095; G05B 2219/39192
See application file for complete search history.

(56) References Cited

U.S. PATENT DOCUMENTS

2016/0136812 A1* 5/2016 Hosek .................... B25J 9/1638
700/254
2017/0018446 A1* 1/2017 Yin .................... H01L 21/68707
2020/0203204 A1* 6/2020 Morikuni ................ H01L 21/68

FOREIGN PATENT DOCUMENTS

JP 2007-027378 A 2/2007

* cited by examiner

*Primary Examiner* — Spencer D Patton
(74) *Attorney, Agent, or Firm* — Armstrong Teasdale LLP

(57) ABSTRACT

A method includes: receiving a substrate on a first stage by a holder of a substrate transfer mechanism; causing the substrate to pass through a first measurement part, and measuring a first true deviation amount between the holder and the substrate at a first position; causing, when transferring the substrate toward a second stage, the substrate to pass through a second measurement part, and measuring a second true deviation amount between the holder and the substrate at a second position; reflecting a difference between the first and second true deviation amounts to a physical model to correct the physical model; calculating a position correction amount of the holder on the second stage from a thermal displacement amount of the holder at the second position; and controlling the substrate transfer mechanism based on the position correction amount to perform a position correction of the holder.

16 Claims, 10 Drawing Sheets

SUBSTRATE TRANSFER METHOD AND SUBSTRATE TRANSFER SYSTEM

CROSS-REFERENCE TO RELATED APPLICATION

This application is based upon and claims the benefit of priority from Japanese Patent Application No. 2021-116712, filed on Jul. 14, 2021, the entire contents of which are incorporated herein by reference.

TECHNICAL FIELD

The present disclosure relates to a substrate transfer method and a substrate transfer system.

BACKGROUND

As a processing system that continuously processes a plurality of substrates, there is known a processing system that includes a load-lock chamber, a plurality of processing chambers each configured to perform a predetermined process on a substrate, and a common transfer chamber to which the load-lock chamber and the plurality of processing chambers are connected and which includes a substrate transfer mechanism.

Such a processing system is disclosed in Patent Document 1. In the processing system disclosed in Patent Document 1, the common transfer chamber has a longitudinal direction in one direction, the common transfer chamber is provided with a slider mechanism having a base stand movable in the longitudinal direction, and the substrate transfer mechanism is provided on the base stand to be bendable/stretchable and rotatable. In addition, in the processing system disclosed in Patent Document 1, a plurality of misalignment detection units are spaced apart from each other at predetermined intervals to correspond to positions at which the base stand should be stopped in order to detect the misalignment of a substrate held by the substrate transfer mechanism. A controller controls the operation of the substrate transfer mechanism such that a detection value of any one of the plurality of misalignment detection units is used as a reference detection value and correction of thermal expansion/contraction is performed on detection values of other misalignment detection units.

PRIOR ART DOCUMENT

Patent Document

Patent Document 1: Japanese Laid-Open Patent Publication No. 2007-027378

SUMMARY

According to one embodiment of the present disclosure, there is provided a substrate transfer method of transferring a substrate to a target position of a second stage by a substrate transfer system including a substrate transfer mechanism provided with a holder configured to hold the substrate and configured to transfer the substrate from a first stage to the second stage, a first measurement part configured to measure a position of the substrate at a first measurement position adjacent to the first stage, and a second measurement part configured to measure the position of the substrate at a second measurement position, wherein the substrate transfer method includes: receiving the substrate on the first stage by the holder; causing the substrate held by the holder to pass through the first measurement part, and measuring a first true deviation amount between the holder and the substrate at the first measurement position, wherein the first true deviation amount is obtained from a detection value detected by the first measurement part and a thermal displacement amount of the holder; causing, when transferring the substrate held by the holder toward the second stage, the substrate to pass through the second measurement part, and measuring a second true deviation amount between the holder and the substrate at the second measurement position, wherein the second true deviation amount is obtained from a detection value detected by the second measurement part and the thermal displacement amount of the holder; reflecting a difference between the first true deviation amount and the second true deviation amount to a physical model configured to estimate the thermal displacement amount at the second measurement position, and correcting the physical model such that a model error is reduced; calculating a position correction amount of the holder on the second stage from the thermal displacement amount of the holder at the second measurement position, wherein the position correction amount is estimated from the corrected physical model, the deviation amount between the holder and the substrate, wherein the deviation amount is the detection value detected by the second measurement part, and the thermal displacement value of the holder on the second stage; and controlling the substrate transfer mechanism based on the position correction amount to perform a position correction of the holder, and deliver the substrate on the holder to the second stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments will be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing System>

Figure 1:
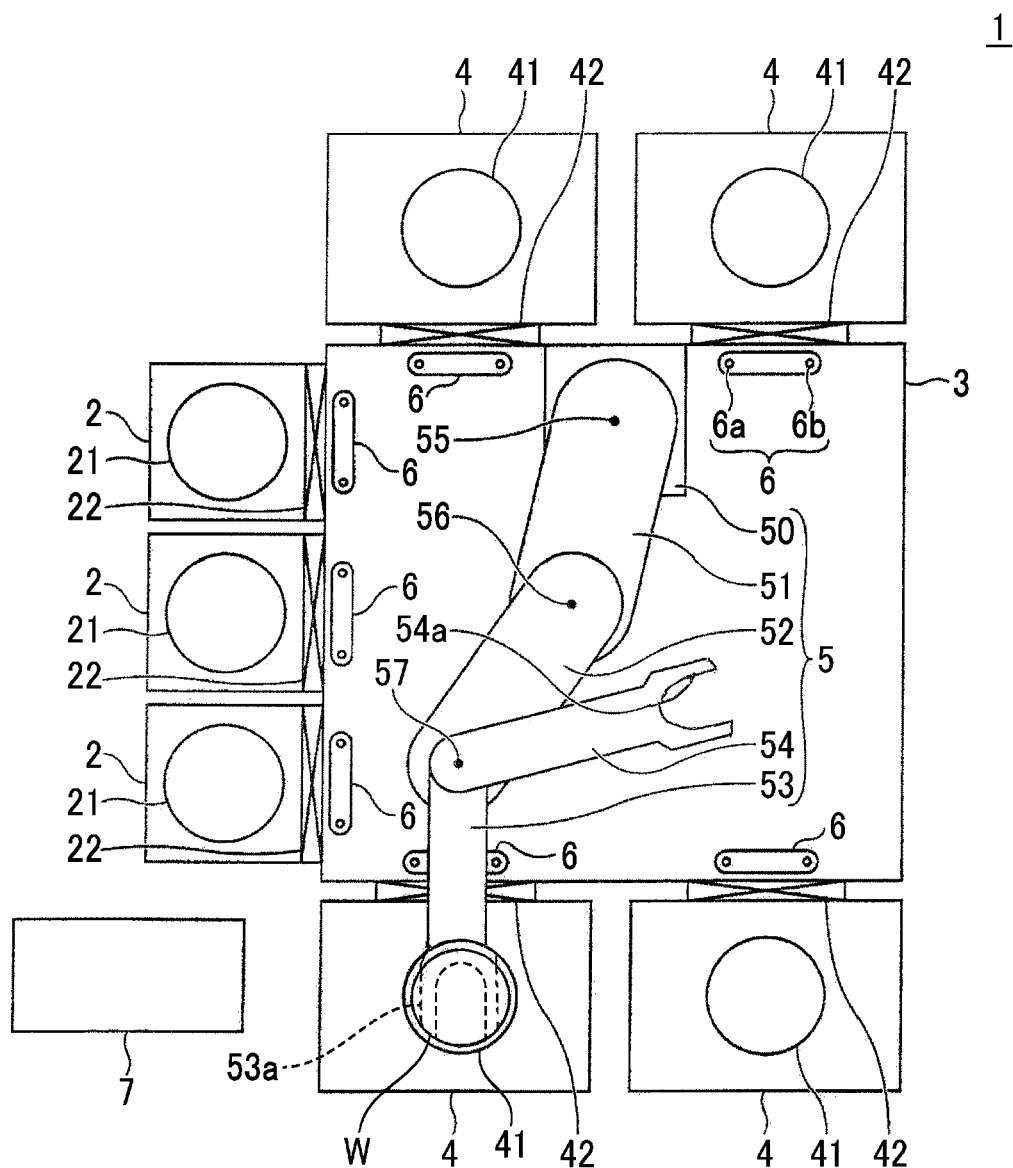
FIG. 1 is a schematic plan view illustrating an example of an overall configuration of a substrate processing system.

First, a substrate processing system including a substrate transfer system according to an embodiment will be described. FIG. 1 is a schematic plan view illustrating an example of an overall configuration of the substrate processing system.

A substrate processing system 1 illustrated in FIG. 1 processes a substrate W in a vacuum atmosphere, and is configured as a cluster structure (multi-chamber type) system. An example of the substrate W includes, but is not limited to, a wafer such as a semiconductor wafer.

The substrate processing system 1 includes a load-lock chamber 2, a vacuum transfer chamber 3, a processing chamber 4, a substrate transfer mechanism 5, a sensor unit 6, and a controller 7. A substrate transfer system according to an embodiment includes the substrate transfer mechanism 5, the sensor unit 6, and the controller 7.

The vacuum transfer chamber 3 has a rectangular planar shape. The interior of the vacuum transfer chamber is depressurized to a vacuum atmosphere by a vacuum exhaust part (not illustrated). The substrate transfer mechanism 5 is provided inside the vacuum transfer chamber 3. Three load-lock chambers 2 are connected to the wall corresponding to one long side of the vacuum transfer chamber 3. In addition, a total of four processing chambers 4 are connected to opposite walls corresponding to the two short sides, two processing chambers for each wall.

The load-lock chambers 2 are provided between the vacuum transfer chamber 3 and an atmospheric transfer chamber (not illustrated) and each provided therein with a stage 21 on which the substrate W is placed. A gate valve 22 is provided between each load-lock chamber 2 and the vacuum transfer chamber 3, and a gate valve (not illustrated) is also provided between each load-lock chamber 2 and the atmospheric transfer chamber. The load-lock chamber 2 and the vacuum transfer chamber 3 in a vacuum atmosphere communicate with each other/are shut off by opening/closing the gate valve 22. The load-lock chamber 2 and the atmosphere transfer chamber also communicate with each other/are shut off by opening/closing the gate valve (not illustrated). An internal pressure of each load-lock chamber 2 may be controlled between atmospheric pressure and vacuum atmosphere, in a state in which both gate valves are closed. When the substrate W is delivered to the atmospheric transfer chamber, the interior of the load-lock chamber 2 is made into an air atmosphere, and the gate valve on the side of the atmospheric transfer chamber is opened. When the substrate W is delivered to the vacuum transfer chamber 3, the interior of the load-lock chamber 2 is made into a vacuum atmosphere, and the gate valve 22 is opened.

As described above, the processing chambers 4 are connected to the walls corresponding to the short sides of the vacuum transfer chamber 3 and each provided therein with a stage 41 on which the substrate W is placed. Each processing chamber 4 is depressurized to a vacuum atmosphere. Inside the processing chamber 4, a desired process (e.g., an etching process, a film forming process, a cleaning process, an ashing process, or the like) is performed on the substrate W placed on the stage 41. Between each processing chamber 4 and the vacuum transfer chamber 3, a gate valve 42 is provided. The processing chamber 4 and the vacuum transfer chamber 3 communicate with the gate valve 42 and are shut off by opening/closing the gate valve 42.

The substrate transfer mechanism 5 transfers substrates between the stages 21 of the load-lock chambers 2 and the stages 41 of the processing chambers 4. The substrate transfer mechanism 5 is configured as an articulated arm including, for example, a base 50, a first arm 51, a second arm 52, a third arm 53, and a fourth arm 54. The base 50 and one side of the first arm 51 in the longitudinal direction are rotatably connected to each other by a rotation axis 55. The other side of the first arm 51 in the longitudinal direction and one side of the second arm 52 in the longitudinal direction are rotatably connected to each other by a rotation axis 56. The other side of the second arm 52 in the longitudinal direction and the one side of the third arm 53 in the longitudinal direction are rotatably connected to each other by a rotation axis 57. The other side of the third arm 53 in the longitudinal direction includes a holder 53a that holds (places) the substrate W thereon. In addition, the other side of the second arm 52 in the longitudinal direction and one side of the fourth arm 54 in the longitudinal direction are rotatably connected to each other by a rotation axis 57. The other side of the fourth arm 54 in the longitudinal direction includes a holder 54a that holds (places) the substrate W thereon. The details of the substrate transfer mechanism 5 will be described later.

Inside the vacuum transfer chamber 3, sensor units (measurement parts) 6 that detect the substrate W transferred by the substrate transfer mechanism 5 are provided to correspond to the four processing chambers 4 and the three load-lock chambers 2, respectively. Each of the sensor units 6 is provided at a position through which the substrate W passes when the substrate transfer mechanism 5 transfers the substrate W from a corresponding one of the processing chambers 4 or the load-lock chambers 2 to the vacuum transfer chamber 3, or when the substrate transfer mechanism 5 transfers the substrate W from the vacuum transfer chamber 3 to a corresponding one of the processing chambers 4 or the load-lock chambers 2.

Each of the sensor units 6 includes two sensors 6a and 6b. The sensors 6a and 6b are, for example, photoelectric sensors. When the substrate W transferred by the substrate transfer mechanism 5 passes through the sensors 6a and 6b, four points on the outer edge of the substrate W may be detected by the sensors 6a and 6b.

The controller 7 controls the operation of each component of the substrate processing system 1, such as the substrate transfer mechanism 5, an exhaust system of the load-lock chambers 2, the vacuum transfer chamber 3 and the processing chambers 4, the gate valves 22 and 42, and the like. The controller 7 is typically a computer, and includes a main controller, an input device, an output device, a display device, and a storage device. The main controller includes a central processing unit (CPU), RAM, and ROM. The storage device includes a computer-readable storage medium such as a hard disk, and is configured to record and read information necessary for control. In the controller 7, the CPU uses the RAM as a work region to execute a program such as a processing recipe stored in the storage medium of the ROM or the storage device, thereby controlling processing of the substrate W or transfer of the substrate W in the substrate processing system 1.

As will be described later, the controller 7 receives information on the thermal expansion of the substrate transfer mechanism 5 and corrects the positions of the holder 53a and the holder 54a of the substrate transfer mechanism 5.

The controller 7 detects edge coordinates of the substrate W held by the holder 53a of the third arm 53 based on the detection of the outer edge of the substrate W by a sensor unit 6 (sensors 6a and 6b) and the operation of the substrate transfer mechanism 5 at that time. Then, the controller 7 calculates the center position of the substrate W from the detected outer edge coordinates of the four points. Therefore, the sensor unit 6 and the controller 7 function as a measurement part that measures the center position of the substrate W held by the third arm 53. The controller 7 detects a deviation (eccentric amount) between a reference position (the center position of the holder 53a) on which the substrate W is placed in the third arm 53, wherein the reference position is set in advance, and the center position of the substrate W held on the holder 53a of the third arm 53, wherein the center position of the substrate is detected by the sensor unit 6. The controller 7 also controls the holder 54a of the fourth arm 54 in the same manner.

<Substrate Transfer Mechanism>

Figure 2:
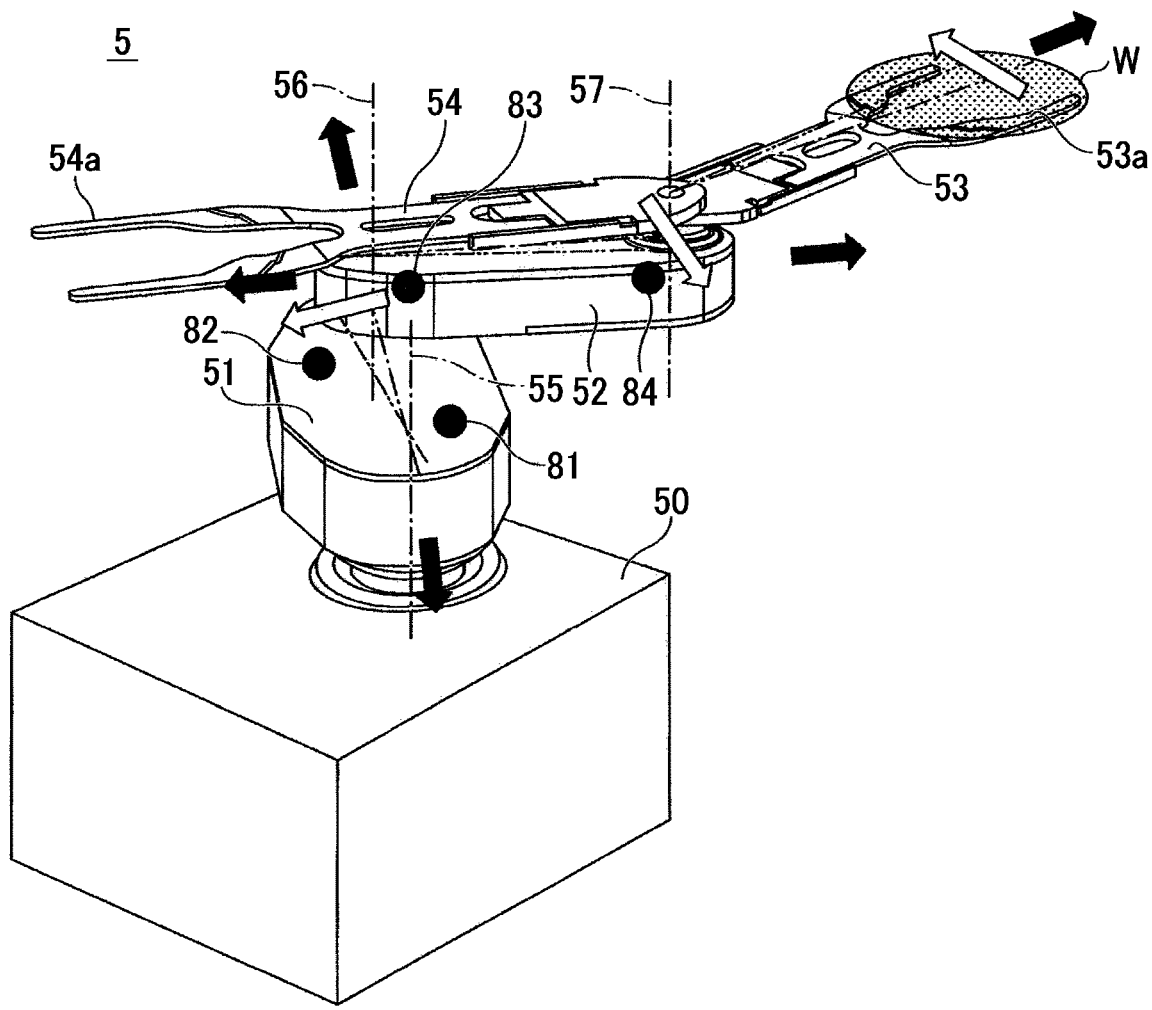
FIG. 2 is a perspective view illustrating an example of a substrate transfer mechanism.
Figure 3:
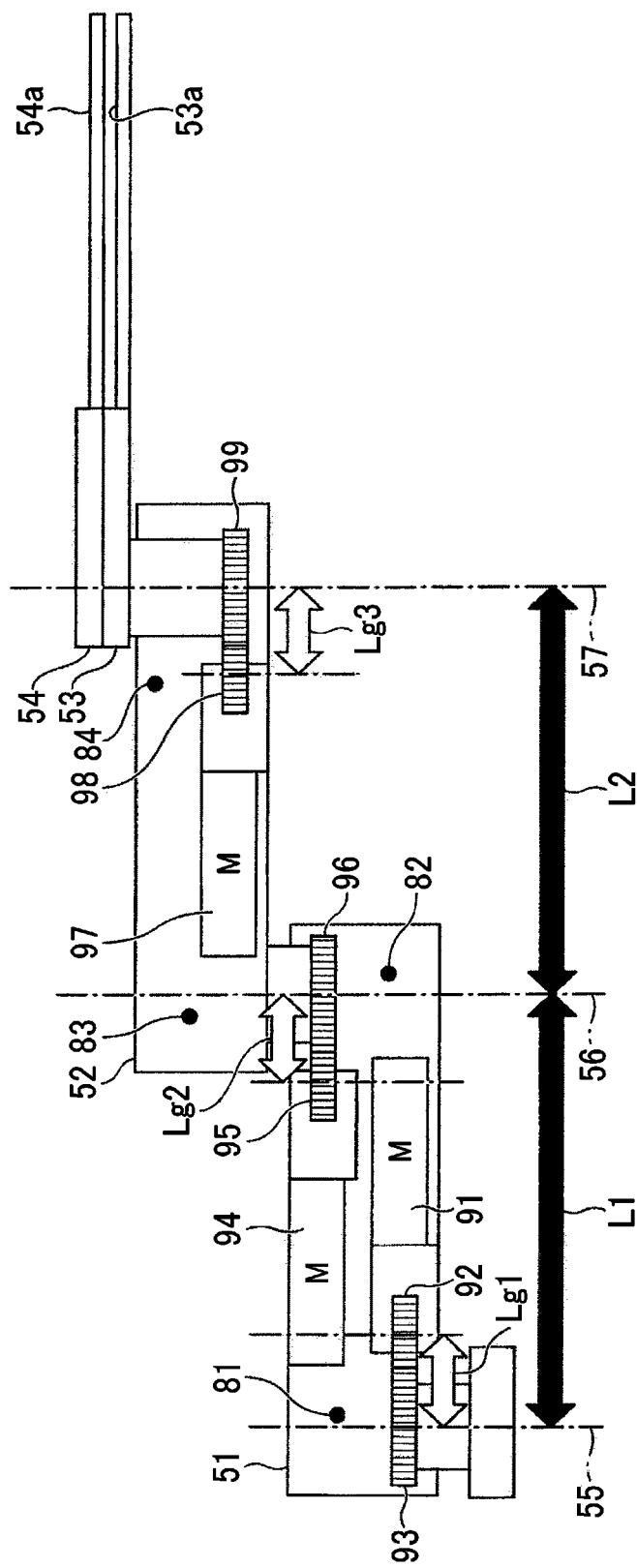
FIG. 3 is a schematic view illustrating a structure of the example of the substrate transfer mechanism.

Next, the substrate transfer mechanism 5 will be described in more detail with reference to FIGS. 2 and 3. FIG. 2 is a perspective view illustrating an example of the substrate transfer mechanism 5, and FIG. 3 is a schematic view illustrating the structure of an example of the substrate transfer mechanism 5.

In the substrate transfer mechanism 5, a first axis motor 91, a gear 92 rotated by the first axis motor 91, and a gear 93 that is engaged with the gear 92 are provided on the lower side in the first arm 51. The gear 93 is fixed to the base 50 and is arranged coaxially with the rotation axis 55. The gears 92 and 93 configures a power transmission mechanism. By rotating the gear 92 by the first axis motor 91, the first arm 51 is rotated around the rotation axis 55 with respect to the base 50.

Further, on the upper side in the first arm 51, a second axis motor 94, a gear 95 rotated by the second axis motor 94, and a gear 96 that is engaged with the gear 95 are provided. The gear 96 is fixed to the second arm 52 and is arranged coaxially with the rotation axis 56. The gears 95 and 96 constitute a power transmission mechanism. By rotating the gear 95 by the second axis motor 94, the second arm 52 is rotated around the rotation axis 56 with respect to the first arm 51.

In the second arm 52, a third axis motor 97, a gear 98 rotated by the third axis motor 97, and a gear 99 that is engaged with the gear 98 are provided. A gear 99 is fixed to the third arm 53 and is arranged coaxially with the rotation axis 57. The gears 98 and 99 constitute a power transmission mechanism. By rotating the gear 98 by the third axis motor 97, the third arm 53 is rotated around the rotation axis 57 with respect to the second arm 52. Similarly, inside the second arm 52, a motor (not illustrated) that rotates the fourth arm 54 and a power transmission mechanism (not illustrated) constituted with a pair of gears are provided. The fourth arm 54 is rotated about the rotation axis 57 with respect to the second arm 52 by the motor via the power transmission mechanism.

The first arm 51 is provided with temperature sensors (temperature detectors) 81 and 82. As the temperature sensors 81 and 82, for example, thermocouples may be used. The temperature sensor 81 is provided on one side of the first arm 51 in the longitudinal direction (the side of the rotation axis 55), and the temperature sensor 82 is provided on the other side of the first arm 51 in the longitudinal direction (the side of the rotation axis 56). Information about the temperature of the first arm 51 detected by the temperature sensors 81 and 82 is input to the controller 7.

The second arm 52 is provided with temperature sensors (temperature detectors) 83 and 84. As the temperature sensors 83 and 84, for example, thermocouples may be used. The temperature sensor 83 is provided on one side of the second arm 52 in the longitudinal direction (the side of the rotation axis 56), and the temperature sensor 84 is provided on the other side of the second arm 52 in the longitudinal direction (the side of the rotation axis 57). The temperature of the second arm 52 detected by the temperature sensors 83 and 84 is input to the controller 7.

Next, the thermal expansion in the substrate transfer mechanism 5 will be described.

In the substrate transfer mechanism 5, the first axis motor 91 or the like provided therein serves as a heat source and generates heat. In addition, when the processing chamber 4 has a high temperature, heat is input from the processing chamber 4 to the substrate transfer mechanism 5. Furthermore, heat is input to the substrate transfer mechanism 5 from a hot substrate W processed in the processing chamber 4. As a result, thermal expansion occurs in the substrate transfer mechanism 5.

In the following description, it is assumed that an inter-axis distance between the rotation axis 55 and the rotation axis 56 (a link length of the first arm 51) is L1 and an inter-axis distance between the rotation axis 56 and the rotation axis 57 (a link length of the second arm 52) is L2. In addition, it is assumed that an inter-axis distance between the gear 92 and the gear 93 is Lg1, an inter-axis distance between the gear 95 and the gear 96 is Lg2, and an inter-axis distance between the gear 98 and the gear 99 is Lg3 (see FIG. 3). The material of each of the gears 92, 95 and 98 is, for example, Fe, and the material of each of the first arm 51, the second arm 52, the third arm 53, the fourth arm 54, and the gears 93, 96 and 99 is, for example, Al.

As indicated by the black arrows in FIG. 2, when heat is input to the substrate transfer mechanism 5, the first arm 51, the second arm 52, the third arm 53, and the fourth arm 54 thermally expand in the longitudinal direction.

In addition, backlash of the gears 92 and 93 increases due to the thermal expansion of the gears 92 and 93. In FIG. 2, the position of the central axis of the first arm 51 in the longitudinal direction is indicated by the alternate long and short dash line, and the position of the central axis of the first arm 51 in the longitudinal direction, which is subjected to backlash, is indicated by the alternate long and two short dashes line. As indicated by the white arrows in FIG. 2, when the first arm 51 is rotated on the rotation axis 55 by the gears 92 and 93, an angle transmission error occurs. Similarly, in the gears 95 and 96 and the gears 98 and 99 as well, backlash increases and an angle transmission error occurs.

Figure 4:
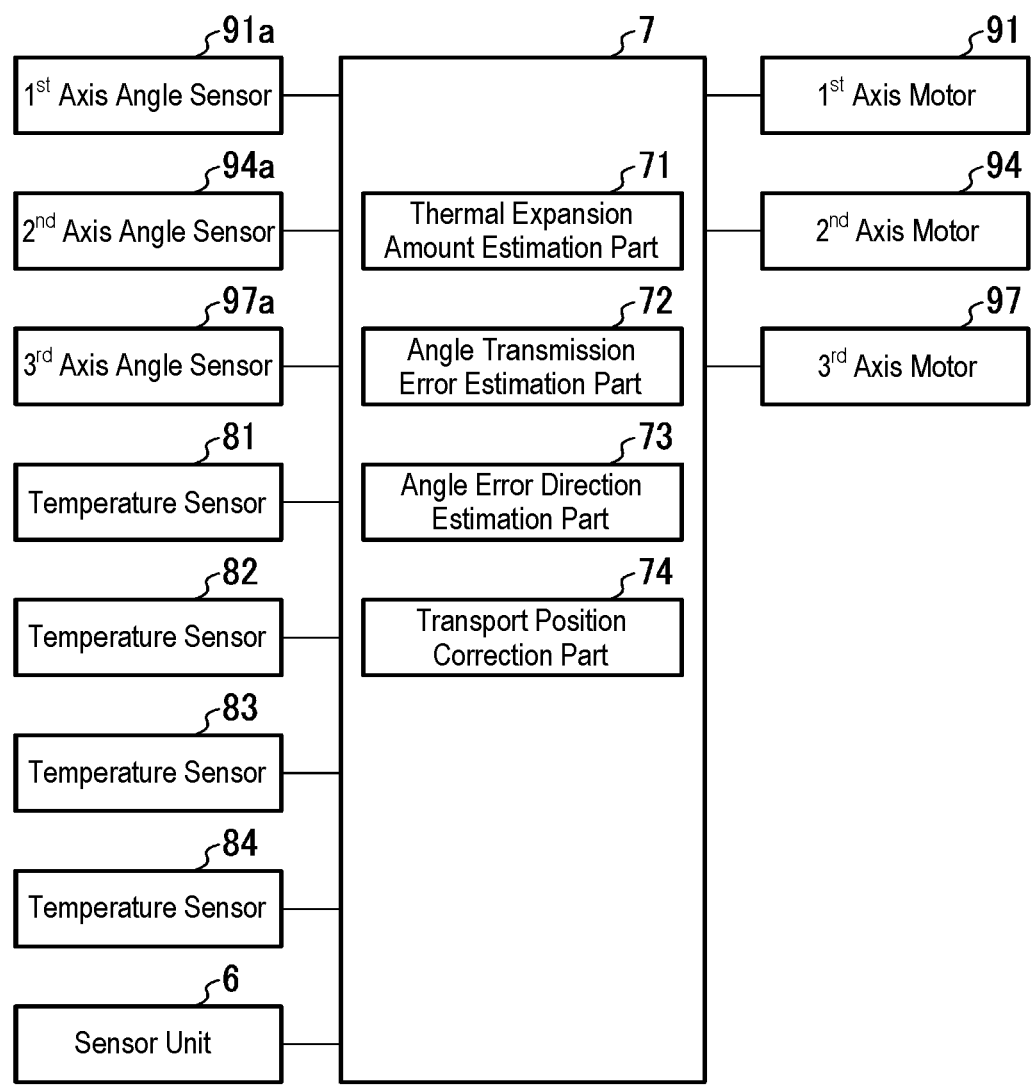
FIG. 4 is a functional block diagram when the substrate transfer mechanism is controlled by a controller.

FIG. 4 is a functional block diagram when the substrate transfer mechanism 5 is controlled by the controller 7. The controller 7 performs the control of the substrate transfer mechanism 5, including the correction of thermal expansion.

The substrate transfer mechanism 5 includes a first axis angle sensor 91a, a second axis angle sensor 94a, and a third axis angle sensor 97a that detect a rotation angle of the first axis motor 91, a rotation angle of the second axis motor 94, and a rotation angle of the third axis motor 97, respectively. Then, values detected by the first axis angle sensor 91a, the second axis angle sensor 94a, and the third axis angle sensor 97a are input to the controller 7. The controller 7 controls the operation of the substrate transfer mechanism 5 by controlling the first axis motor 91, the second axis motor 94, and the third axis motor 97 based on the values detected by the first axis angle sensor 91a, the second axis angle sensor 94a, and the third axis angle sensor 97a.

In addition, the values detected by the temperature sensors 81 to 84 and the values detected by the sensor unit 6 are also input to the controller 7.

The controller 7 includes a thermal expansion amount estimation part 71, an angle transmission error estimation part 72, an angle error direction estimation part 73, and a transfer position correction part 74.

The thermal expansion amount estimation part 71 estimates the thermal expansion amounts of the first arm 51 and the second arm 52.

When estimating the thermal expansion amount of the first arm 51, the thermal expansion amount estimation part 71 estimates the thermal expansion amount based on, for example, the temperature of the first arm 51, the thermal expansion coefficient of the first arm 51, and the reference link length L1 of the first arm 51. The temperature of the first arm 51 is detected by the temperature sensors 81 and 82. For example, the average value of the temperature sensors 81 and 82 may be the temperature of the first arm 51. When the first arm 51 is made of Al, the thermal expansion coefficient of the first arm 51 may be the thermal expansion coefficient of Al. The reference link length L1 of the first arm 51 is the link length of the first arm 51 at a reference temperature.

When estimating the thermal expansion amount of the second arm 52, the thermal expansion amount estimation part 71 estimates the thermal expansion amount based on, for example, the temperature of the second arm 52, the thermal expansion coefficient of the second arm 52, and the reference link length L2 of the second arm 52. The temperature of the second arm 52 is detected by the temperature sensors 83 and 84. For example, the average value of the temperature sensors 83 and 84 may be the temperature of the second arm 52. When the second arm 52 is made of Al, the thermal expansion coefficient of the second arm 52 may be the thermal expansion coefficient of Al. The reference link length L2 of the second arm 52 is the link length of the second arm 52 at the reference temperature.

The angle transmission error estimation part 72 estimates an amount of angle transmission error due to gear backlash.

When estimating the amount of angle transmission error when the first arm 51 is rotated by the rotation axis 55, the angle transmission error estimation part 72 estimates the amount of angle transmission error based on, for example, the temperatures of the gears 92 and 93, a difference between the thermal expansion coefficients of the gears 92 and 93, and the distance Lg1 between the reference axes of the gears 92 and 93. The temperatures of the gears 92 and 93 are detected by, for example, the temperature sensor 81. When the gear 92 is made of Fe and the gear 93 is made of Al, the difference in the thermal expansion coefficients between the gears 92 and 93 may be a difference between the thermal expansion coefficient of Al and the thermal expansion coefficient of Fe. The distance Lg1 between the reference axes is an inter-axis distance of the gears 92 and 93 at the reference temperature.

When estimating the amount of angle transmission error when the second arm 52 is rotated by the rotation axis 56, the angle transmission error estimation part 72 estimates the amount of angle transmission error based on, for example, the temperatures of the gears 95 and 96, a difference between the thermal expansion coefficients of the gears 95 and 96, and the distance Lg2 between the reference axes of the gears 95 and 96. The temperatures of the gears 95 and 96 are detected by, for example, the temperature sensor 82. When the gear 95 is made of Fe and the gear 96 is made of Al, the difference in the thermal expansion coefficients between the gears 95 and 96 may be a difference between the thermal expansion coefficient of Al and the thermal expansion coefficient of Fe. The distance Lg2 between the reference axes is an inter-axis distance of the gears 95 and 96 at the reference temperature.

When estimating the amount of angle transmission error when the third arm 53 is rotated by the rotation axis 57, the angle transmission error estimation part 72 estimates the amount of angle transmission error based on, for example, the temperatures of the gears 98 and 99, a difference between the thermal expansion coefficients of the gears 98 and 99, and the distance Lg3 between the reference axes of the gears 98 and 99. The temperatures of the gears 98 and 99 are detected by, for example, the temperature sensor 84. When the gear 98 is made of Fe and the gear 99 is made of Al, the difference in the thermal expansion coefficients between the gears 98 and 99 may be a difference between the thermal expansion coefficient of Al and the thermal expansion coefficient of Fe. The distance Lg3 between the reference axes is the inter-axis distance of the gears 98 and 99 at the reference temperature. The angle transmission error estimation part 72 also estimates the amount of angle transmission error when the fourth arm 54 is rotated by the rotation axis 57 in the same manner.

The angle error direction estimation part 73 estimates a direction of the angle transmission error. The angle error direction estimation part 73 estimates the direction of the angle transmission error when the first arm 51 is rotated by the rotation axis 55 based on the acceleration/deceleration state of the first axis motor 91. The angle error direction estimation part 73 estimates the direction of the angle transmission error when the second arm 52 is rotated by the rotation axis 56 based on the acceleration/deceleration state of the second axis motor 94 in the same manner. The angle error direction estimation part 73 estimates the direction of the angle transmission error when the third arm 53 is rotated using the rotation axis 57 based on the acceleration/deceleration state of the third axis motor 97. The direction of the angle transmission error when the fourth arm 54 is rotated by the rotation axis 57 is also estimated in the same manner.

The estimation of the direction of the angle transmission error will be described with reference to FIGS. 5A and 5B and FIGS. 6A and 6B.

Figure 5A:
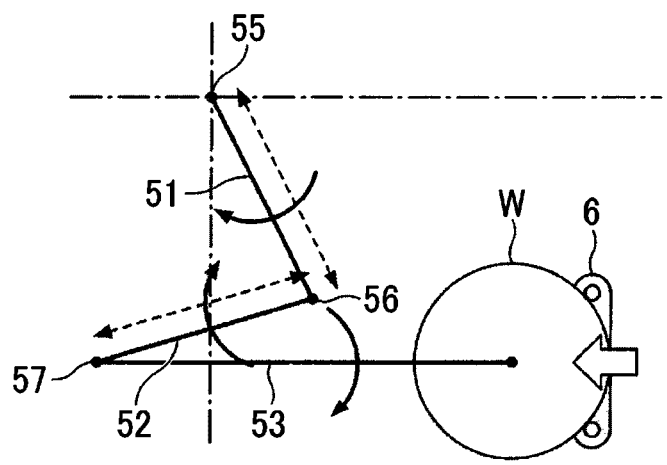
FIGS. 5A and 5B are views schematically illustrating postures of the substrate transfer mechanism.
Figure 5B:
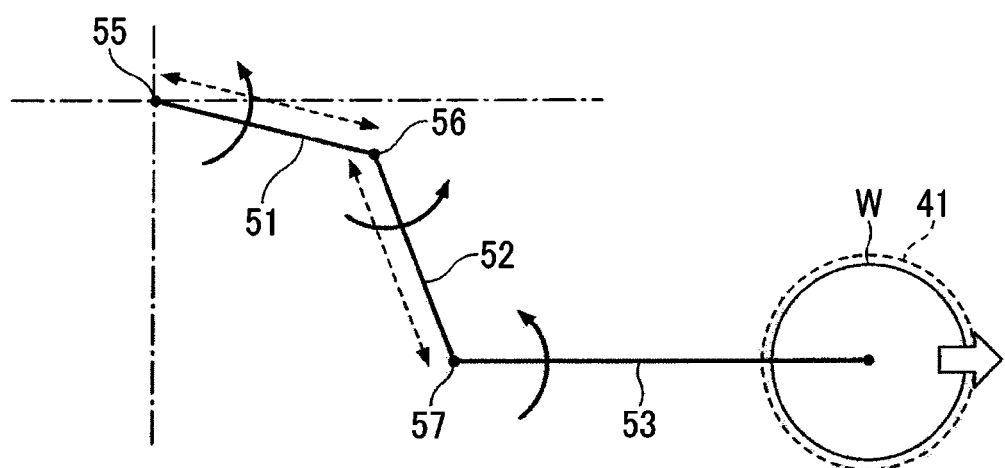

FIGS. 5A and 5B are views schematically illustrating postures of the substrate transfer mechanism 5. FIG. 5A is a view illustrating an example of the posture of the substrate transfer mechanism 5 when the substrate W is located at a measurement position measured by a sensor unit 6. FIG. 5B is a view illustrating an example of the posture of the substrate transfer mechanism 5 when the substrate W to be transferred is located at a target position.

As indicated by the broken line arrows, the link lengths of the first arm 51 and the second arm 52 are thermally expanded. Since the reference positions on the third arm 53 and the fourth arm 54 on which the substrate W is placed are set to a predetermined distance from the rotation axis 57, the thermal expansion of the third arm 53 and the fourth arm 54 does not have to be taken into consideration.

At the measurement position illustrated in FIG. 5A, the substrate transfer mechanism 5 allows the substrate W to pass over the sensor unit 6 in a state of accelerating the substrate W. As a result, the substrate W being transferred receives an inertial force in the direction indicated by the white arrow. The substrate transfer mechanism 5 causes the substrate W to be directed to the target position of the stage 41 in a state in which the substrate W is decelerated, and then stops the transfer of the substrate W at the target position as illustrated in FIG. 5B. Therefore, the substrate W being transferred receives an inertial force in the direction indicated by the white arrow.

Figure 6A:
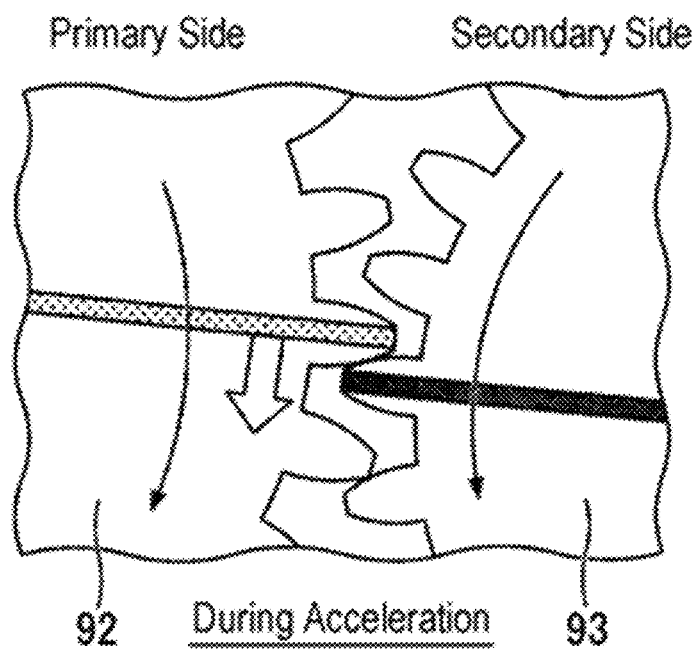
FIGS. 6A and 6B are views illustrating a relationship between an acceleration/deceleration state and an error direction of an angle transmission error.
Figure 6B:
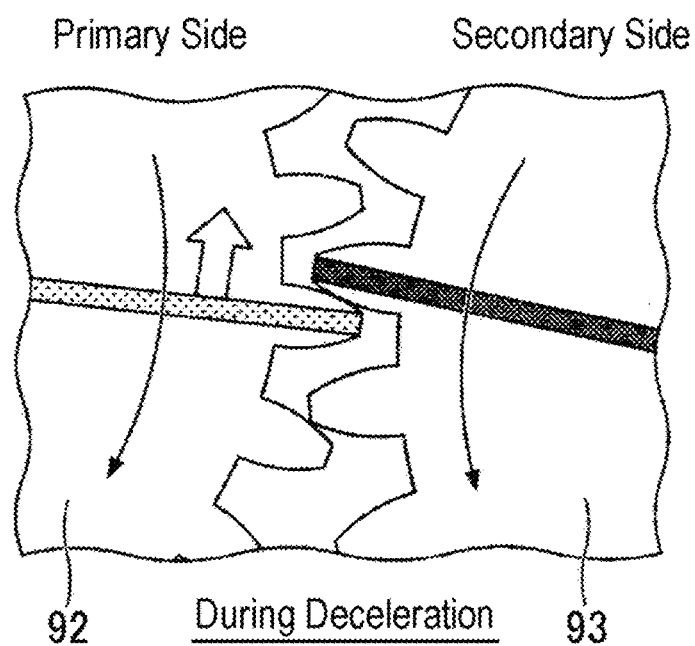

Here, a relationship between an acceleration/deceleration state and the error direction of the angle transmission error will be described with reference to FIGS. 6A and 6B. FIGS. 6A and 6B are exemplary views each illustrating the error direction of the angle transmission error. FIG. 6A illustrates the error direction of the angle transmission error during acceleration of the first axis motor 91. FIG. 6B illustrates the error direction of the angle transmission error during deceleration of the first axis motor 91. The solid arrows indicate the rotation directions of each gear.

During acceleration of the first axis motor 91 illustrated in FIG. 6A, a primary side gear 92 rotates clockwise, and a secondary side gear 93 rotates counterclockwise. At this time, the teeth of the primary side gear 92 are in contact with the teeth of the secondary side gear 93 in a direction of pushing the teeth of the secondary side gear 93 due to an inertial force. As a result, an angle transmission error due to backlash occurs in the direction indicated by the white arrow.

Meanwhile, during deceleration of the first axis motor 91 illustrated in FIG. 6B, the primary side gear 92 rotates clockwise, and the secondary side gear 93 rotates counterclockwise. At this time, the teeth of the secondary side gear 93 are in contact with the teeth of the primary side gear 92 in the direction of pushing the teeth of the primary side gear 92 due to an inertial force. As a result, an angle transmission error due to backlash occurs in the direction indicated by the white arrow.

In this way, the direction of the angle transmission error due to the backlash of the gears 92 and 93 which are power transmission mechanisms, varies depending on the acceleration and deceleration of the first axis motor 91. The same applies to the direction of the angle transmission error due to the backlash of the gears 95 and 96 which are the power transmission mechanisms of the second axis motor 94, and the gears 98 and 99 which are the power transmission mechanisms of the third axis motor 97. An example of the directions of the angle transmission error are indicated by the solid arrows in FIGS. 5A and 5B, in which the direction of the angle transmission error changes at the measurement position in FIG. 5A and the target position in FIG. 5B.

Assuming that the temperature change of the substrate transfer mechanism 5 during the transfer of the substrate W is sufficiently small, it may be considered that the amounts of thermal expansion of the first arm 51 and the second arm 52 and amounts of angle transmission error at the rotation axes 55, 56, and 57 at the measurement position and the transfer position are not changed.

When the substrate transfer mechanism 5 performs substrate transfer of receiving one substrate on one side of the stage 21 of the load-lock chamber 2 and the stage 41 of the processing chamber 4 and delivering another substrate on the other side, the transfer position correction part 74 corrects the misalignment of the substrate transfer mechanism 5 such that the transfer position of the substrate W becomes the target position. The correction amount at this time includes a displacement (thermal displacement) due to the thermal expansion of the substrate transfer mechanism 5, and the thermal displacement amount stored in the transfer position correction part 74 is estimated by using a physical model.

That is, as described above, the substrate transfer mechanism 5 includes the arms 51 to 54 which are rotatably connected to each other, and the motors 91, 94, and 97 that rotate the arms 51 to 54 via the gears that are power transmission mechanisms. The physical model for estimating the amounts of thermal displacement of the holders 53a and 54a is expressed by an equation of the amounts of thermal expansion of the arms 51 to 54 estimated based on the temperature of the arms 51 to 54, the angles of joints which are the connecting portions of the arms, and an angular delay amount (an amount of angle transmission error) estimated based on the temperature, and the like.

In the present embodiment, a difference between a true deviation amount between the holder 53a or 54a and the substrate W, in which the thermal displacement amount at a measurement position when the substrate is delivered to the stage of a transfer destination (at the time of putting) is taken into consideration, and a true deviation amount between the holder 53a or 54a and the substrate W, in which the thermal displacement amount at the measurement position when the substrate is received from the stage of a transfer source (at the time of getting) is taken into consideration, is reflected to a physical model for estimating the thermal displacement amount at the measurement position at the time of putting by the transfer position correction part 74.

This point will be described in detail below by taking as an example a case in which the transfer source is the stage 21, the transfer destination is the stage 41, and the substrate W is placed on and transferred by the holder 53a.

The controller 7 controls the substrate transfer mechanism 5 such that the substrate W is transferred to a target position on the stage 41, and a deviation occurs at the transfer position due to the deviation when the holder 53a receives the substrate W or a thermal displacement of the holder 53a due to the thermal expansion of the substrate transfer mechanism 5. The misalignment on the stage 41 is obtained from a deviation amount (X3, Y3) between the substrate W and the holder 53a, which is a value detected by the sensor unit 6 adjacent to the processing chamber 4, the thermal displacement amount (X1, Y1) of the measurement position by the sensor unit 6, and the thermal displacement amount (X2, Y2) of the holder 53a in the stage 41.

Figure 7A:
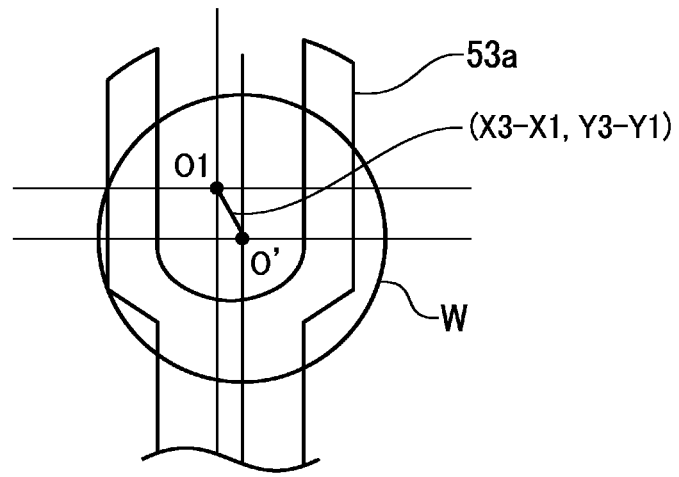
FIGS. 7A and 7B are views for explaining a true deviation amount between a holder and a substrate and a true deviation amount of the holder on a stage.
Figure 7B:
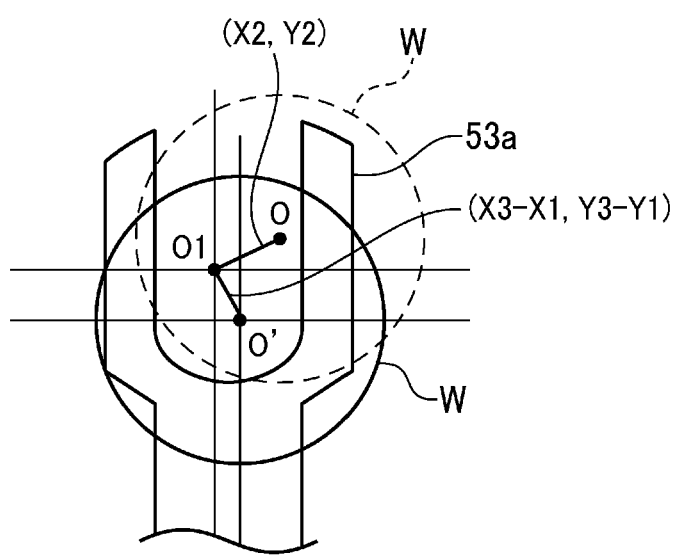

Specifically, (X3, Y3) is the deviation amount between the reference position (center position of the holder 53a) and the center position of the substrate W held by the holder 53a. In addition, (X1, Y1) is a misalignment amount of the holder 53a due to the thermal expansion of the substrate transfer mechanism 5 at the measurement position at the time of putting. (X2, Y2) appears as the misalignment of the reference position of the third arm 53 (the holder 53a) with respect to the target position of the substrate W. The true deviation amount between the holder 53a and the substrate W is obtained by taking the thermal expansion of the substrate transfer mechanism 5 at the measurement position into consideration. Specifically, as illustrated in FIG. 7A, the true deviation amount is (X3-X1, Y3-Y1) derived from the detected value (X3, Y3) expressed as a deviation amount in setting and the thermal displacement amount (X1, Y1) at the measurement position (the misalignment amount of the holder 53a due to thermal expansion at the measurement position). In FIG. 7A, the center of the substrate W is indicated by O' and the reference position is indicated by O1. In addition, in the stage 41, as illustrated in FIG. 7B, the deviation amount due to thermal expansion between the reference position O1 and the target position O is (X2, Y2). The deviation amount of the substrate W from the target position on the stage 41 of the transfer destination is obtained by adding the thermal displacement amount (X2, Y2) on the stage 41 to the true deviation amount (X3-X1, Y3-Y1). Therefore, the position correction amount of the holder 53a at this time equals minus (−) (the true deviation amount between the holder 53a and the substrate W plus the thermal displacement amount at the stage 41), wherein the value thereof is (−X3−X2+X1, Y3−Y2+Y1). Therefore, it is possible to control the transfer position of the substrate W on the holder 53a to the target position by controlling the first axis motor 91, the second axis motor 94, the third axis motor 97, and the like of the substrate transfer mechanism 5 to correct the position of the holder 53a with the above-mentioned correction amount.

As described above, the thermal displacement amount of the correction amount of the substrate transfer mechanism 5 is calculated by using a physical model. For example, as the physical model for obtaining X1 which is the X coordinate of the thermal displacement amount at the measurement position at the time of putting, the following Equation (1) may be used. The same applies to Y1, which is the Y coordinate.

$$X1 = L1 \cos \Omega1' \alpha1 \Delta T + L2 \cos \Omega2' \alpha2 \Delta T + L3 \cos \Omega3' \alpha3 \Delta T + L1(\cos \Omega1' - \cos \Omega1) + L2(\cos \Omega2' - \cos \Omega2) + L3(\cos \Omega3' - \cos \Omega3) \qquad (1)$$

Where, L1, L2, and L3 are the link length of the first arm 51, the link length of the second arm, and the link length of the third arm, respectively, as described above. α1, α2, and α3 are the linear expansion coefficient of a first link, the linear expansion coefficient of a second link, and the linear expansion coefficient of a third link, respectively (the initial values are all the same numerical values as the coefficient of thermal expansion of the material of the arms). Ω1, Ω2, and Ω3 are a first joint angle, a second joint angle, and a third joint angle (all of which are design values), respectively, at the time of putting. Ω1', Ω2', and Ω3' are Ω1'=Ω1+ΔΩ1, Ω2'=Ω2+ΔΩ2, and Ω3'=Ω3+ΔΩ3, respectively, wherein ΔΩ1, ΔΩ2, and ΔΩ3 are angular delay amounts (which are proportional to ΔT) due to the increase in the inter-axis distances of gears.

However, when using a physical model for a thermal displacement amount, the consistency of the physical model becomes a problem. That is, by using the physical model, it is possible to correct the position in consideration of the thermal displacement of the substrate transfer mechanism 5, but there is always a model error in the physical model. For example, the physical model of the above-described Equation (1) representing the thermal displacement at the time of putting also includes a model error. Therefore, there is also a limit to the accuracy of position correction.

In order to reduce such a model error, the transfer position correction part 74 of the present embodiment uses a difference between the true deviation amount between the holder 53a and the substrate W, in which the thermal displacement amount at the measurement position at the time of putting is also taken into consideration, and the true deviation amount between the holder 53a and the substrate W, in which the thermal displacement amount at the measurement position at the time of getting is also taken into consideration. Ideally, the true deviation amounts show the same value, as described below.

It is assumed that at the time of getting the detection value of the sensor unit 6 adjacent to the load-lock chamber 2 is (X3', Y3'), and the thermal displacement amount at the measurement position by the sensor unit 6 is (X1', Y1'). Specifically. (X3', Y3') is the deviation amount between the reference position (the center position of the holder 53a) in the setting of the third arm 53 and the center position of the substrate W held by the holder 53a. In addition, specifically, (X1', Y1') is a misalignment amount of the holder 53a due to the thermal expansion of the substrate transfer mechanism 5 at the measurement position at the time of getting. The true deviation amount between the holder 53a and the substrate W is (X3'−X1', Y3'−Y1') derived from the detected value (X3', Y3') expressed as the deviation amount in setting and the thermal displacement amount (X1', Y1') at the measurement position (the misalignment amount of the holder 53a due to thermal expansion).

The thermal displacement amount (X1', Y1') at the measurement position at the time of getting may also be obtained by using a physical model. As the physical model for obtaining X1' which is the X coordinate of the thermal displacement amount at the measurement position at the time of getting, for example, the following Equation (2) may be used.

$$X1' = L1 \cos \Theta1' \alpha1 \Delta T + L2 \cos \Theta2' \alpha2 \Delta T + L3 \cos \Theta3' \alpha3 \Delta T + L1(\cos \Theta1' - \cos \Theta1) + L2(\cos \Theta2' - \cos \Theta2) + L3(\cos \Theta3' - \cos \Theta3) \qquad (2)$$

Where, L1, L2, L3, α1, α2, and α3 are the same as those in Equation (1), and Θ1, Θ2, and Θ3 are the first joint angle, the second joint angle, and the third joint angle (all of which are design values), respectively, at the time of getting. Θ1', Θ2', and Θ3' are Θ1'=Θ1+ΔΘ1, Θ2'=Θ2+ΔΘ2, and Θ3'=Θ3+ΔΘ3, respectively, wherein ΔΘ1, ΔΘ2, and ΔΘ3 are angular delay amounts (which are proportional to ΔT) due to the increase in the inter-axis distances of gears.

The true deviation amount (X3−X1, Y3−Y1) in which the thermal displacement between the holder 53a and the substrate W at the time of putting and the true displacement amount (X3'−X1', Y3'−Y1') between the holder 53a and the substrate W at the time of getting should ideally have the same value, as described above. However, the true deviation amounts do not actually have the same value, and a difference occurs therebetween. For example, regarding the X coordinates, a difference A occurs between (X3−X1) and (X3'−X1'). This is because, except for a detection error in the sensor unit 6, an error occurs in the estimated thermal displacement amount due to the model error of the physical model.

Therefore, the transfer position correction part 74 reflects, to a physical model for calculating a thermal displacement amount at the measurement position at the time of putting, the difference between the true deviation amount between the holder 53a and the substrate W at the measurement position at the time of putting (the true deviation amount at the measurement position at the time of putting) and the true deviation amount between the holder 53a and the substrate W at the measurement position at the time of getting (the true deviation amount at the measurement position at the time of getting) to correct the physical model such that the model error is reduced. For example, a correction term that reflects the difference between the true deviation amount at the measurement position at the time of putting and the true deviation amount at the measurement position at the time of getting is added to the initial physical model.

As a specific example, a difference A is calculated by (the true displacement amount at the measurement position at the time of putting) minus (the true displacement amount at the measurement position at the time of getting), and A/2, which is a simple average A, is added to X1, which is the initial physical model of the thermal displacement amount at the measurement position at the time of putting to correct the physical model to X1(Ave) represented as the following Equation (3). This makes it possible to reduce the error of the physical model.

$$X1(Ave)=X1+A/2 \qquad (3)$$

As described above, the position correction amount of the substrate transfer mechanism 5 equals minus (−) (the true deviation amount between the holder 53a and the substrate W plus the thermal displacement amount at the stage 41), wherein the initial value of the X coordinate thereof is −X3−X2+X1. Therefore, X1 of the initial position correction amount is replaced with X1(Ave), and the position correction amount is calculated as −X3−X2+X1(Ave). The same applies to the Y coordinate. As a result, it is possible to correct the physical model with a small error by a simple method. This also makes it possible to improve the position correction accuracy and thus to improve the transfer accuracy of the substrate W. In this example, the initial physical model is used for the thermal displacement amount X2 used for the transfer position correction.

Alternatively, the following method may be used as another method.

In the physical models of Equations (1) and (2) above, the following Equations (4) and (5), in which an error factor β(ΔT) expressed as a function of ΔT not included in these models is added as a correction term, are used.

$$X1=L1 \cos \Omega1'\alpha1\Delta T+L2 \cos \Omega2'\alpha2\Delta T+L3 \cos \Omega3'\alpha3 \Delta T+L1(\cos \Omega1'-\cos \Omega1)+L2(\cos \Omega2'-\cos \Omega2)+L3(\cos \Omega3'-\cos \Omega3)+\beta(\Delta T) \qquad (4)$$

$$X1'=L1 \cos \Theta1'\alpha1 \Delta T+L2 \cos \Theta2'\alpha2\Delta T+L3 \cos \Theta3'\alpha3\Delta T+L1(\cos \Theta1'-\cos \Theta1)+L2(\cos \Theta2'-\cos \Theta2)+L3(\cos \Theta3'-\cos \Theta3)+\beta(\Delta T) \qquad (5)$$

In Equations (4) and (5) above, ΔΘ1 and ΔΩ21, ΔΘ2 and ΔΩ2, and ΔΘ3 and ΔΩ23 are proportional to a first inter-axis distance of gears, a second inter-axis distance of gears, and a third inter-axis distance of gears, respectively, and are calculated from the same physical amount. The same applies to L1, L2, and L3, ΔT, and α. Therefore, these parameters are fitted such that the difference A becomes the smallest. For example, these parameters are solved by using a linear programming method or the like, or parameters with a small error are derived through machine learning or the like. As the function of ΔT, one having a functional type of being proportional to ΔT, proportional to the square of ΔT, proportional to the exponent of ΔT, and so on may be used.

For example, X1(True) may be calculated as the true value of X1 by changing the arguments (the numerical values of physical amounts in the physical model) in the equation by using Equations (4) and (5) above such that the difference A equals 0, that is, (X3−X1)−(X3'−X1')=0. In this case, fitting is performed by using a linear programming method or the like such that (X3'−X1')−(X3−X1)=0, and the physical amounts of Equations (4) and (5) above, i.e., L1, L2, L3, Θ1', Θ2', Θ3'', α, β, and ΔT are determined. Then, L1, L2, L3, ΔΩ1, ΔΩ2, ΔΩ3, α, β, and ΔT obtained in this way are used as true values, and X1 (True) is calculated from an equation which is of the same type as Equations (4) and (5). X1(True) is an equation derived by fitting such that the difference A=0 is satisfied, and has a very small error.

When X1(True) is used, it is possible to correct the physical model of the above-mentioned thermal displacement amount X2 used for the transfer position correction. At this time, it is possible to estimate X2(True) by using the physical amounts used when estimating X1(True) as true values, and calculating X2(True) with a physical model obtained by adding, to the initial physical model of X2, an error factor β(ΔT) expressed as a function of ΔT not included in this mode.

It is possible to calculate X2(True) by the following Equation (6) by using L1, L2, L3, ΔΘ1, ΔΘ2, ΔΘ3, α, β, and ΔT obtained by the calculation of X1(True) as true values.

$$X2(True)=L1 \cos \xi1'\alpha\Delta T+L2 \cos \xi2'\alpha\Delta T+L3 \cos \xi3'\alpha\Delta T+L1(\cos \xi1'-\cos \xi1)+L2(\cos \xi2'-\cos \xi2)+L3(\cos \xi3'-\cos \xi3)+\beta(\Delta T) \qquad (6)$$

Where, ξ1, ξ2, and ξ3 are a first joint angle, a second joint angle, and a third joint angle (all of which are design values), respectively. ξ1', ξ2', and ξ3' are ξ1'=ξ1+Δξ1, ξ2'=ξ2+Δξ2, and ξ3'=ξ3+Δξ3, respectively, wherein Δξ1, Δξ2, and Δξ0 are angular delay amounts (which are proportional to ΔT) due to the increase in the inter-axis distances of gears, and wherein Δξ1=ΔΩ1, Δξ2=ΔΩ2, and Δξ3=ΔΩ3.

X2(True) is obtained by the same equation as X1(True), and has a very small error like X1(True).

As described above, the position correction amount of the substrate transfer mechanism 5 is expressed as minus (−) (the true deviation amount between the holder 53a and the substrate W plus the thermal displacement amount at the stage 41), wherein the initial value of the X coordinate thereof is −X3−X2+X1. Therefore, X1 of the initial position correction amount is replaced with X1(True), X2 is replaced with X2(True), and the position correction amount is calculated as −X3−X2(True)+X1 (True). The same applies to the Y coordinate. In the case of this example, by correcting X1 to X1(True), it is possible to reduce the error of the thermal displacement amount at the measurement position as well as the error of the thermal displacement amount on the stage. Thus, it is possible to further improve the accuracy in the position correction of the substrate transfer mechanism.

<Substrate Transfer Method>

Next, an example of a substrate transfer method using the substrate transfer mechanism 5 will be described in detail.

Here, a case in which the substrate W is transferred from the stage 21 of the load-lock chamber 2 to the stage 41 of the processing chamber 4 by the holder 53a of the third arm 53 will be described.

Figure 8:
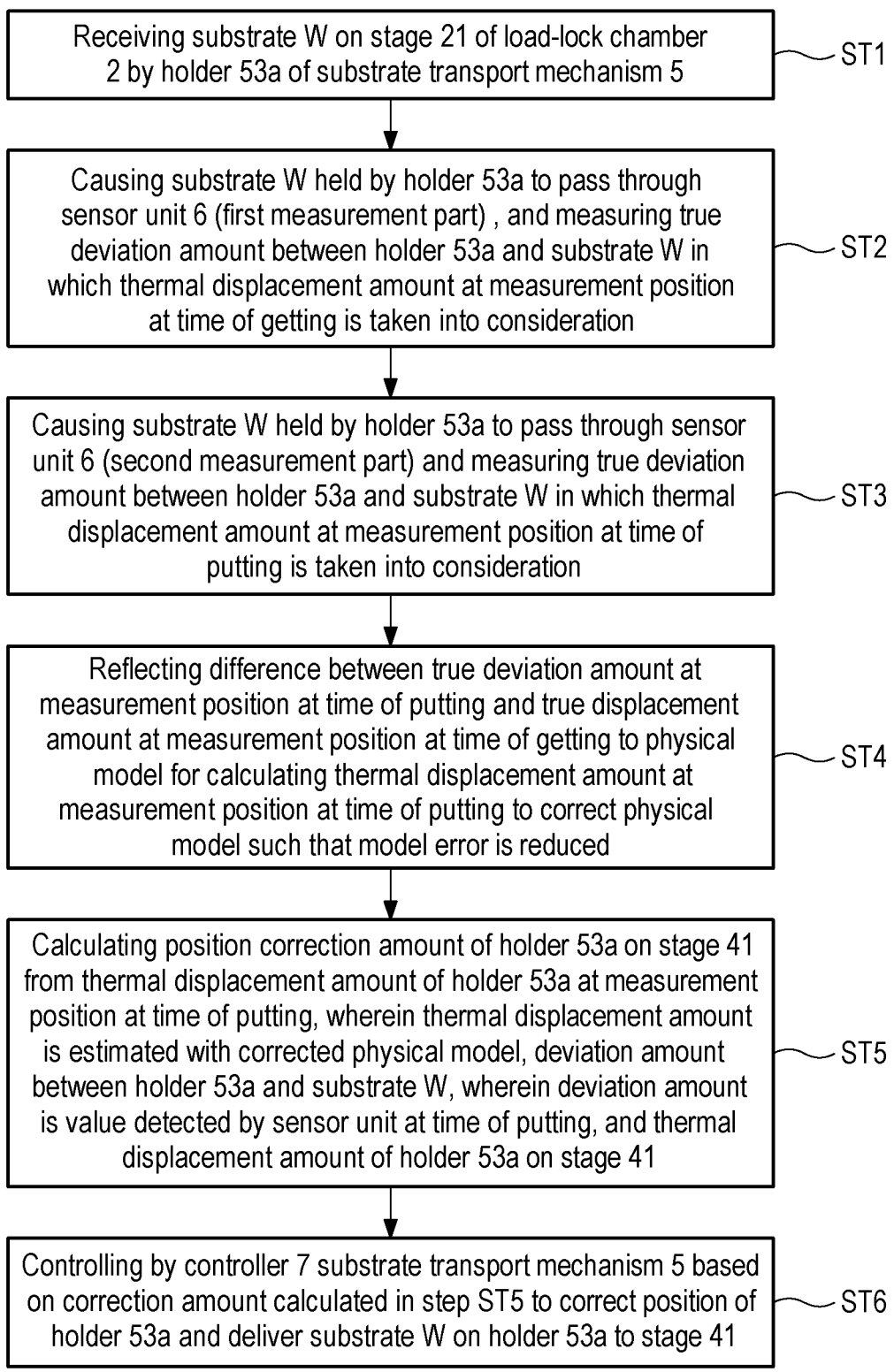
FIG. 8 is a flowchart illustrating an example of a substrate transfer method.

FIG. 8 is a flowchart illustrating an example of the substrate transfer method.

First, the substrate W on the stage 21 of the load-lock chamber 2 is received by the holder 53a of the substrate transfer mechanism 5 (step ST1).

Subsequently, while retracting the holder 53a that holds the substrate W, the substrate W is caused to pass through the sensor unit 6 (the first measurement part) adjacent to the load-lock chamber 2, and a true deviation amount between the holder 53a and the substrate W is measured in which a thermal displacement amount at the measurement position at the time of getting is taken into consideration (step ST2). As described above, the true deviation amount at this time is (X3'−X1', Y3'−Y1') derived from the detected value (X3', Y3') expressed as the deviation amount in setting and the thermal displacement amount (X1', Y1') at the measurement position (the misalignment amount of the holder 53a due to thermal expansion).

Subsequently, while the substrate W is transferred toward the processing chamber 4 and the holder 53a that holds the substrate W extends toward the stage 41, the substrate W is caused to pass through the sensor unit 6 (the second measurement part) adjacent to the processing chamber 4 and the true deviation amount between the holder 53a and the substrate W in which a thermal displacement amount at the measurement position at the time of putting is taken into consideration (step ST3). As described above, the true deviation amount at this time is (X3−X1, Y3−Y1) derived from the detected value (X3, Y3) expressed as the deviation amount in setting and the thermal displacement amount (X1, Y1) at the measurement position (the misalignment amount of the holder 53a due to thermal expansion).

Subsequently, the difference between the true deviation amount at the measurement position at the time of putting and the true displacement amount at the measurement position at the time of getting is reflected to a physical model for calculating the thermal displacement amount at the measurement position at the time of putting to correct the physical model so that the model error is reduced (step ST4).

Subsequently, the position correction amount of the holder 53a on the stage 41 is calculated from the thermal displacement amount of the holder 53a at the measurement position at the time of putting, wherein the thermal displacement amount is estimated with the corrected physical model, the deviation amount between the holder 53a and the substrate W, wherein the deviation amount is a value detected by the sensor unit 6 at the time of putting, and the thermal displacement amount of the holder 53a on the stage 41 (step ST5).

Subsequently, based on the correction amount calculated in step ST5, the controller 7 controls the substrate transfer mechanism 5 to correct the position of the holder 53a and deliver the substrate W on the holder 53a to the stage 41 (step ST6).

As described above, in the present embodiment, the difference between the true deviation amount at the measurement position at the time of putting and the true deviation amount at the measurement position at the time of getting is reflected to the physical model for calculating the thermal displacement amount at the measurement position at the time of putting to correct the physical model and to reduce the error of the physical model. As a result, it is possible to improve the position correction accuracy with respect to the misalignment of the substrate transfer mechanism 5 due to thermal expansion, and to transfer the substrate W to the target position with high accuracy.

Subsequently, a specific example of a process of correcting the physical model in step ST4 and the step of calculating the position correction amount of the substrate transfer mechanism 5 in step ST5 will be described.

Figure 9:
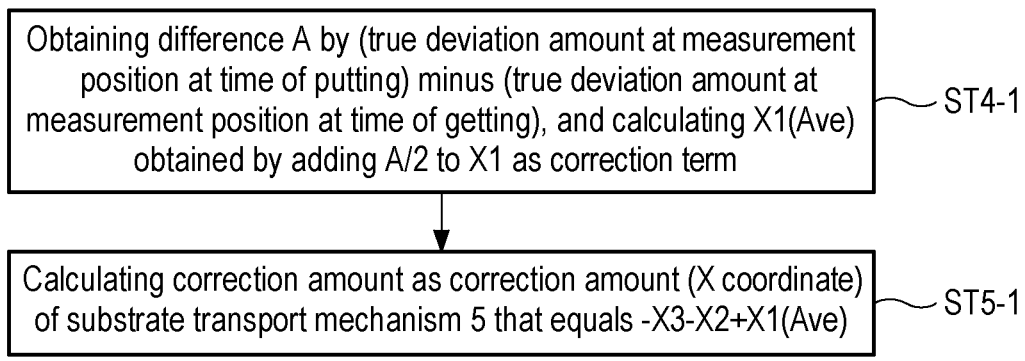
FIG. 9 is a flowchart illustrating a first example as a specific example of steps ST4 and ST5 in FIG. 8.

A first example is a case illustrated in FIG. 9 in which the above-mentioned X1(Ave) is used.

First, the difference A is obtained by (the true deviation amount at the measurement position at the time of putting) minus (the true deviation amount at the measurement position at the time of getting), and according to Equation (3) above, X1(Ave) obtained by adding A/2 to X1 as a correction term is calculated (step ST4-1).

Subsequently, the correction amount is calculated as the correction amount (X coordinate) of the substrate transfer mechanism 5 that equals −X3−X2+X1(Ave) (step ST5-1).

In this way, since it is only necessary to take and average the difference between the true deviation amount at the measurement position at the time of putting and the true deviation amount at the measurement position at the time of getting, it is possible to easily correct the physical model with a small error. This also makes it possible to improve the position correction accuracy and thus to improve the transfer accuracy of the substrate W.

Figure 10:
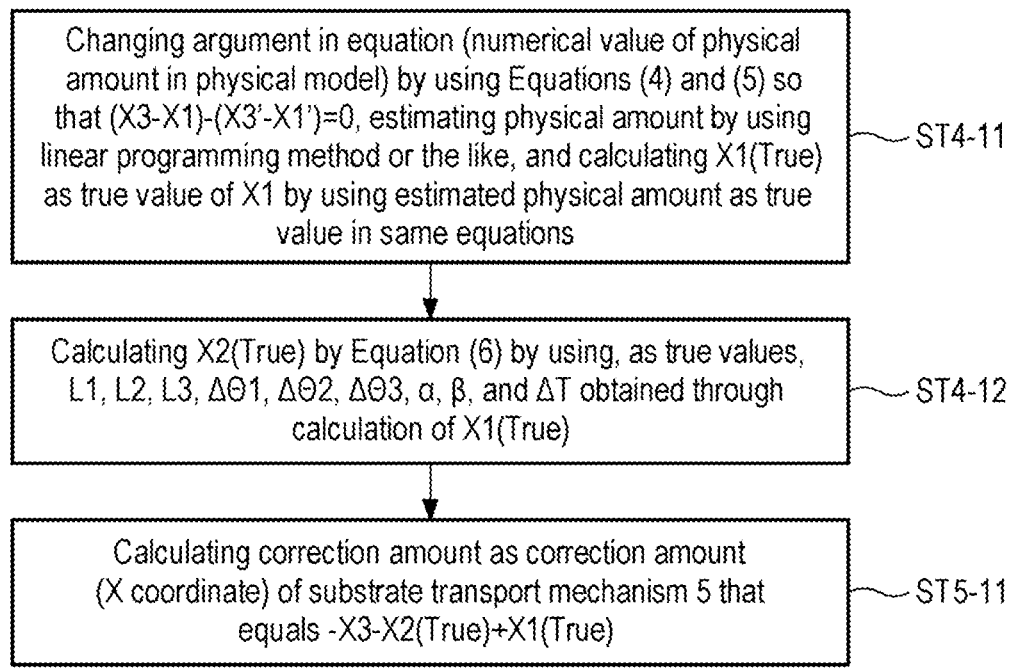
FIG. 10 is a flowchart illustrating a second example as a specific example of steps ST4 and ST5 in FIG. 8.

A second example is a case illustrated in FIG. 10 in which the numerical values of physical amounts in a physical model are changed by using the error factor $\beta(\Delta T)$ represented in Equations (4) and (5) above.

First, for example, arguments in an equation (the numerical values of physical amounts in the physical model) are changed by using Equations (4) and (5) above so that the difference A equals 0, that is, (X3−X1)−(X3'−X1')=0, the physical amounts are estimated by using a linear programming method or the like, and X1(True) is calculated as the true value of X1 by using the estimated physical amounts as true values in the same equations (step ST4-11).

Subsequently, X2(True) is calculated by Equation (6) above by using, as true values, L1, L2, L3, $\Delta\Theta1$, $\Delta\Theta2$, $\Delta\Theta3$, $\alpha$, $\beta$, and $\Delta T$ obtained through the calculation of X1(True) (step ST4-12).

Subsequently, the correction amount is calculated as the correction amount (X coordinate) of the substrate transfer mechanism 5 that equals −X3−X2(True)+X1(True) (step ST5-11).

In this example, by changing the numerical values of physical amounts in the physical model and solving (X3−X1)−(X3'−X1')=0, it is possible to derive X1(True), which is a physical model with a small error, and to improve the accuracy. Since it is possible to correct not only the thermal displacement amount of the measurement position but also the physical model of the thermal displacement amount of the stage 41, it is possible to further improve the position correction accuracy for the misalignment of the substrate transfer mechanism 5.

Subsequently, another example of the substrate transfer method will be described in detail.

Here, similarly, a case in which the substrate W is transferred from the stage 21 of the load-lock chamber 2 to the stage 41 of the processing chamber 4 will be described.

Figure 11:
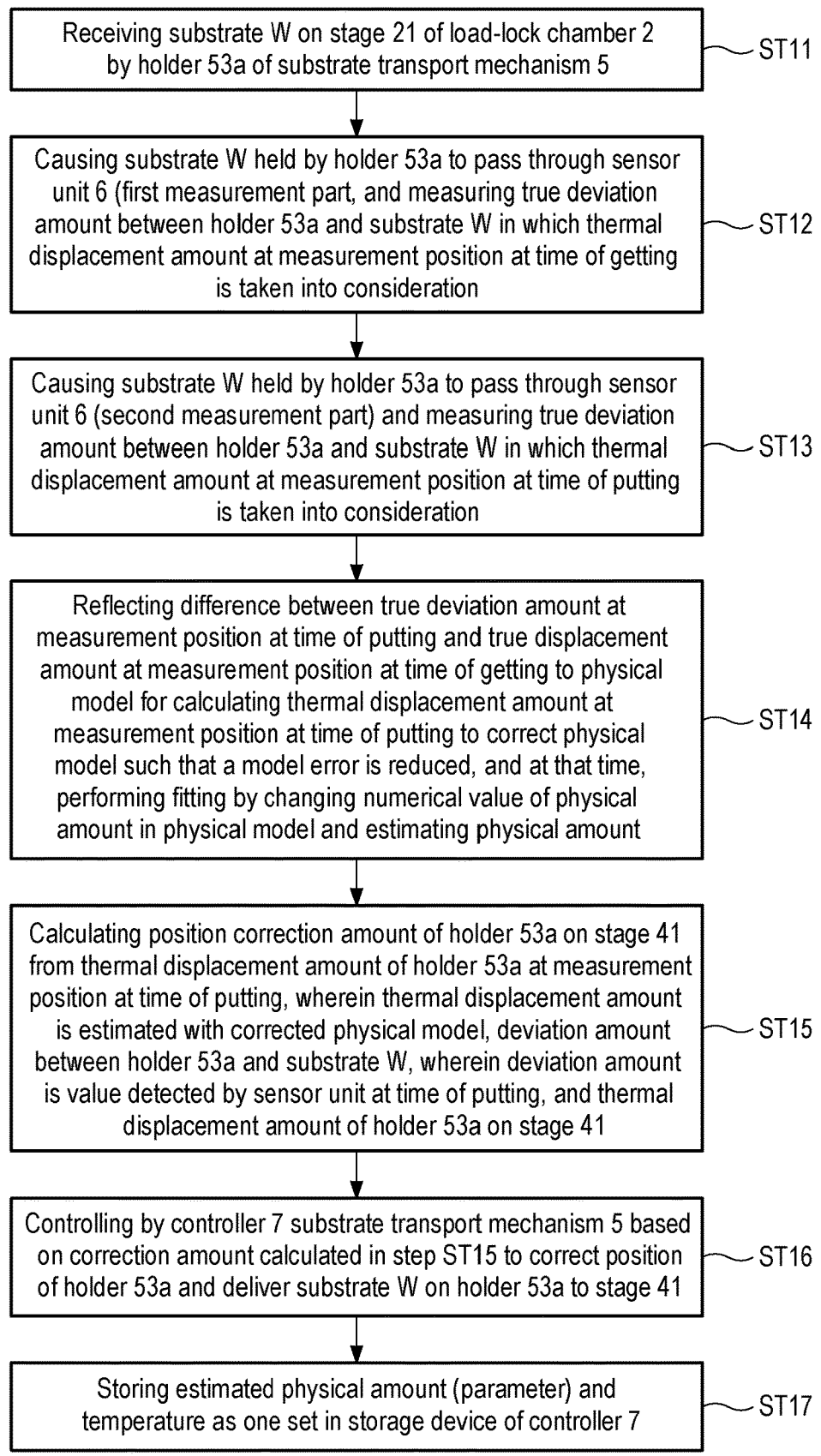
FIG. 11 is a flowchart illustrating another example of the substrate transfer method.

FIG. 11 is a flowchart illustrating another example of the substrate transfer method.

First, as in step ST1, the substrate W on the stage 21 of the load-lock chamber 2 is received by the holder 53a of the substrate transfer mechanism 5 (step ST11).

Subsequently, as in step ST2, while retracting the holder 53a that holds the substrate W, the substrate W is caused to pass through the sensor unit 6 (the first measurement part) adjacent to the load-lock chamber 2, and a true deviation amount between the holder 53a and the substrate W is measured in which a thermal displacement amount at the measurement position at the time of getting is taken into consideration (step ST12).

Subsequently, as in step ST3, while the substrate W is transferred toward the processing chamber 4 and the holder 53a that holds the substrate W extends toward the stage 41, the substrate W is caused to pass through the sensor unit 6 (the second measurement part) adjacent to the processing chamber 4 and the true deviation amount between the holder 53a and the substrate W in which a thermal displacement amount at the measurement position at the time of putting is taken into consideration (step ST13).

Subsequently, the difference between the true deviation amount at the measurement position at the time of putting and the true displacement amount at the measurement position at the time of getting is reflected to a physical model for calculating the thermal displacement amount at the measurement position at the time of putting to correct the physical model so that the error of the model is reduced, and at that time, fitting is performed by changing the numerical values of the physical amounts in the physical model and the physical amounts are estimated (step ST14).

Here, for example, a physical model obtained by adding, to, for example, the initial models represented in Equations (4) and (5) represented in the second example of the above-described specific example, an error factor expressed as a function of temperature, which is not included in the initial physical models, is used. Then, the numerical values of the physical amounts in the physical model (e.g., an arm length, an arm angle, a thermal expansion coefficient, a temperature change, and the like) are changed such that the difference A expressed by (the true deviation amount at the measurement position at the time of putting) minus (the true deviation amount at the measurement position at the time of getting) becomes the smallest, preferably $(X3-X1)-(X3'-X1')=0$. The physical amounts are estimated by using a linear programming method or the like, and X1(True) is calculated by the same equation by using the estimated physical amounts as true values. Then, for the thermal displacement amount X2, a physical model obtained by adding, to the initial physical model represented in Equation 6 above, an error factor expressed as a function of temperature, which is not included in this model, is also used. By using the physical amounts used to obtain X1(True) as a true value, X2(True) is calculated as the true value of X2. These procedures may be performed, for example, in the same manner as in the second example of the above-mentioned specific example.

Subsequently, the position correction amount of the holder 53a on the stage 41 is calculated from the thermal displacement amount of the holder 53a at the measurement position at the time of putting, wherein the thermal displacement amount is estimated with the corrected physical model, the deviation amount between the holder 53a and the substrate W, wherein the deviation amount is a value detected by the sensor unit 6 at the time of putting, and the thermal displacement amount of the holder 53a on the stage 41 (step ST15).

Subsequently, based on the correction amount calculated in step ST15, the controller 7 controls the substrate transfer mechanism 5 to correct the position of the holder 53a and deliver the substrate W on the holder 53a to the stage 41 (step ST16).

Subsequently, an estimated physical amount (parameter) and a temperature are stored as one set in the storage device of the controller 7 (step ST17). Such data storage may be performed each time the substrate W is transferred, or may be performed after transferring a plurality of substrates. Physical amounts (parameters) and temperatures may be stored in a temperature-to-physical amount table, and the table may be updated each time data is entered. Then, the physical amounts may be estimated from this table. However, when an estimation result deviates significantly from the table of physical amounts, an estimated physical amount may be determined by the balance between a residue and an amount of deviation from the table. Instead of using the table, a physical amount may be estimated by using a neural network or the like.

By storing the physical amount (parameter) and the temperature as one set in this way, it is possible to correct a physical model by performing feedback with respect to the physical model held by the controller 7. Therefore, even if an initial physical model is not accurate, it is possible to improve the accuracy of the physical model, and it is possible to perform position correction with high accuracy with respect to the misalignment of the substrate transfer mechanism 5 due to thermal expansion. In addition, it is possible to change a physical model by the system or the substrate transfer mechanism, and it becomes possible to cope with secular variation and machine difference.

Other Applications

Although embodiments have been described above, it should be considered that the embodiments disclosed herein are exemplary in all respect and are not restrictive. The embodiments described above may be omitted, replaced, or modified in various forms without departing from the scope and spirit of the appended claims.

For example, in the above-described embodiments, the case in which the substrate W is transferred from the stage 21 of the load-lock chamber 2 to the stage 41 of the processing chamber 4 by the substrate transfer mechanism 5 has been described, but the present disclosure is not limited thereto. The substrate W may be transferred from the stage 41 to the stage 21. In addition, in the above-described embodiments, the substrate transfer between the load-lock chamber and the processing chamber in the substrate transfer system for performing vacuum transfer has been described, but the present disclosure is not limited thereto.

According to the present disclosure, a substrate transfer method and a substrate transfer system capable of transferring a substrate to a target position with high accuracy by a substrate transfer mechanism are provided.

What is claimed is:

1. A substrate transfer method of transferring a substrate to a target position of a second stage by a substrate transfer system including a substrate transfer mechanism provided with a holder configured to hold the substrate and configured to transfer the substrate from a first stage to the second stage, a first photoelectric sensor configured to measure a position of the substrate at a first measurement position adjacent to the first stage, and a second photoelectric sensor configured to measure the position of the substrate at a second measurement position, wherein the substrate transfer method comprises:

receiving the substrate at the first stage by the holder;

causing the substrate held by the holder to pass through the first photoelectric sensor, and calculating a first true deviation amount based on positions of the holder and the substrate at the first measurement position, wherein the first true deviation amount is obtained from a detection value detected by the first photoelectric sensor and a thermal displacement amount of the holder at the first measurement position;

causing, when transferring the substrate held by the holder toward the second stage, the substrate to pass through the second photoelectric sensor, and calculating a second true deviation amount based on positions of the holder and the substrate at the second measurement position, wherein the second true deviation amount is obtained from a detection value detected by the second photoelectric sensor and a thermal displacement amount of the holder at the second measurement position;

reflecting a difference between the first true deviation amount and the second true deviation amount to a physical model configured to estimate the thermal displacement amount of the holder at the second measurement position, and correcting the physical model such that a model error is reduced;

calculating a position correction amount of the holder at the second stage from the thermal displacement amount of the holder at the second measurement position, wherein the position correction amount is estimated from the corrected physical model, a deviation amount between the holder and the substrate, wherein the deviation amount is the detection value detected by the second photoelectric sensor, and a thermal displacement amount of the holder at the second stage; and controlling the substrate transfer mechanism based on the position correction amount to perform a position correction of the holder, and deliver the substrate on the holder to the second stage.

2. The substrate transfer method of claim 1, wherein the correcting the physical model includes adding, to an initial physical model, a correction term to which the difference between the second true deviation amount and the first true deviation amount is reflected.

3. The substrate transfer method of claim 2, wherein a model obtained by calculating the difference between the second true deviation amount and the first true deviation amount and adding a value of ½ of the difference to the initial physical model of the thermal displacement amount of the holder at the second measurement position is used as the corrected physical model.

4. The substrate transfer method of claim 3, wherein the substrate transfer mechanism has an articulated structure including a plurality of arms and a motor configured to rotate the plurality of arms.

5. The substrate transfer method of claim 1, wherein the physical model is created by adding, to each of a first initial physical model for estimating the thermal displacement amount of the holder at the second measurement position and a second initial physical model for estimating the thermal displacement amount of the holder at the first measurement position, a first error factor which is expressed as a temperature function and not included in the first initial physical model and the second initial physical model, fitting is performed by changing a numerical value of a physical amount in the physical model in which the first error factor is added such that (the second true deviation amount) minus (the first true deviation amount) equals 0 to estimate the physical amount, and the corrected physical model of the thermal displacement amount of the holder at the second measurement position is obtained.

6. The substrate transfer method of claim 5, wherein the physical model is created by adding, to a third initial physical model for estimating the thermal displacement amount of the holder at the second stage, a second error factor which is expressed as the temperature function and not included in the third initial physical model, and a physical model in which the thermal displacement amount of the holder at the second stage is corrected is obtained by using, as a true value, the physical amount used when obtaining the corrected physical model of the thermal displacement amount of the holder at the second measurement position.

7. The substrate transfer method of claim 5, further comprising:

storing the estimated physical amount as a parameter and a temperature as one set in a storage part.

8. The substrate transfer method of claim 1, wherein the substrate transfer mechanism has an articulated structure including a plurality of arms and a motor configured to rotate the plurality of arms.

9. A substrate transfer system comprising:

a substrate transfer mechanism provided with a holder configured to hold the substrate and configured to transfer the substrate from a first stage to a second stage;

a first photoelectric sensor configured to measure a position of the substrate at a first measurement position adjacent to the first stage;

a second photoelectric sensor configured to measure the position of the substrate at a second measurement position; and a controller configured to control the substrate transfer mechanism, wherein the controller performs a control including:

receiving the substrate at the first stage by the holder;

causing the substrate held by the holder to pass through the first photoelectric sensor, and calculating a first true deviation amount based on positions of the holder and the substrate at the first measurement position, wherein the first true deviation amount is obtained from a detection value detected by the first photoelectric sensor and a thermal displacement amount of the holder at the first measurement position;

causing, when transferring the substrate held by the holder toward the second stage, the substrate to pass through the second photoelectric sensor, and calculating a second true deviation amount based on positions of the holder and the substrate at the second measurement position, wherein the second true deviation amount is obtained from a detection value detected by the second photoelectric sensor and a thermal displacement amount of the holder at the second measurement position;

reflecting a difference between the first true deviation amount and the second true deviation amount to a physical model configured to estimate the thermal displacement amount of the holder at the second measurement position, and correcting the physical model such that a model error is reduced;

calculating a position correction amount of the holder at the second stage from the thermal displacement amount of the holder at the second measurement position, wherein the position correction amount is estimated from the corrected physical model, a deviation amount between the holder and the substrate, wherein the deviation amount is the detection value detected by the second photoelectric sensor, and a thermal displacement amount of the holder at the second stage; and controlling the substrate transfer mechanism based on the position correction amount to perform a position correction of the holder, and deliver the substrate on the holder to the second stage.

10. The substrate transfer system of claim 9, wherein the corrected physical model is obtained by adding, to an initial physical model, a correction term to which the difference between the second true deviation amount and the first true deviation amount is reflected.

11. The substrate transfer system of claim 10, wherein the corrected physical model is obtained by calculating the difference between the second true deviation amount and the first true deviation amount and adding a value of ½ of the difference to the initial physical model of the thermal displacement amount of the holder at the second measurement position.

12. The substrate transfer system of claim 11, wherein the substrate transfer mechanism has an articulated structure including a plurality of arms and a motor configured to rotate the plurality of arms.

13. The substrate transfer system of claim 9, wherein the controller performs the control including: creating the physical model by adding, to each of a first initial physical model for estimating the thermal displacement amount of the holder at the second measurement position and a second initial physical model for estimating the thermal displacement amount of the holder at the first measurement position, a first error factor which is expressed as a temperature function and not included in the first initial physical model and the second initial physical model; performing a fitting by changing a numerical value of a physical amount in the physical model in which the first error factor is added such that (the second true deviation amount) minus (the first true deviation amount) equals 0 to estimate the physical amount; and obtaining the corrected physical model of the thermal displacement amount of the holder at the second measurement position.

14. The substrate transfer system of claim 13, wherein the controller performs the control including: creating the physical model by adding, to a third initial physical model for estimating the thermal displacement amount of the holder at the second stage, a second error factor which is expressed as the temperature function and not included in the third initial physical model; and obtaining a physical model in which the thermal displacement amount of the holder at the second stage is corrected by using, as a true value, the physical amount used when obtaining the corrected physical model of the thermal displacement amount of the holder at the second measurement position.

15. The substrate transfer system of claim 13, wherein the controller performs the control including: storing the estimated physical amount as a parameter and a temperature as one set in a storage part.

16. The substrate transfer system of claim 9, wherein the substrate transfer mechanism has an articulated structure including a plurality of arms and a motor configured to rotate the plurality of arms.

* * * * *